United States Patent [19]

Spälti et al.

[11] 4,342,025

[45] Jul. 27, 1982

[54] ARRANGEMENT FOR DETERMINING THE POSITION, ESPECIALLY THE ANGULAR POSITION, OF A MOVABLE BODY

[75] Inventors: Max Spälti, Mutschellen; Vladimir Vanek, Urdorf, both of Switzerland

[73] Assignee: SSIG Equipment S.A., Bienne, Switzerland

[21] Appl. No.: 148,201

[22] Filed: May 9, 1980

[30] Foreign Application Priority Data

May 16, 1979 [CH] Switzerland ............... 4537/79

[51] Int. Cl.$^3$ ............................................. H03K 13/18
[52] U.S. Cl. ........................... 340/347 P; 250/231 SE; 340/347 M
[58] Field of Search .................. 340/347 M, 347 P; 250/231 SE, 227; 350/96.1

[56] References Cited

U.S. PATENT DOCUMENTS

| | | | |
|---|---|---|---|
| 3,594,735 | 7/1971 | Furlong et al. | 340/347 M X |
| 3,594,764 | 7/1971 | Walsh | 340/347 P |
| 3,833,901 | 9/1974 | Fowler | 340/347 P |
| 3,892,468 | 7/1975 | Duguay | 250/227 X |
| 3,958,237 | 5/1976 | Fulenwider | 340/347 P X |
| 4,116,000 | 9/1978 | Martin et al. | 350/96.24 X |

OTHER PUBLICATIONS

American Optical Co. Ad, 7/1968, 1 page.
Callahan, Optical Delay Line Compression, IBM Technical Disclosure Bulletin, vol. 14, No. 8, 12/1971, pp. 2208 and 2209.

Primary Examiner—Thomas J. Sloyan
Attorney, Agent, or Firm—Kontler, Grimes & Battersby

[57] ABSTRACT

An arrangement for determining the position, especially the angular position, of a movable body comprises a plurality of tracks which are movable with the body past individual detecting locations for the respective tracks. Each of the tracks includes markings which are distributed along and among the tracks in accordance with a predetermined code. The presence of the markings at the detecting locations is detected by optical detecting signals which are transmitted to a common signal receiver via individual channels associated with the respective detecting locations. The detecting signals are transmitted through the channels chronologically and thereafter assigned to respective time or space slots of a binary coded, position-indicating output signal by means of a control signal generated at a predetermined instant relative to the sequence of detecting signals.

29 Claims, 10 Drawing Figures

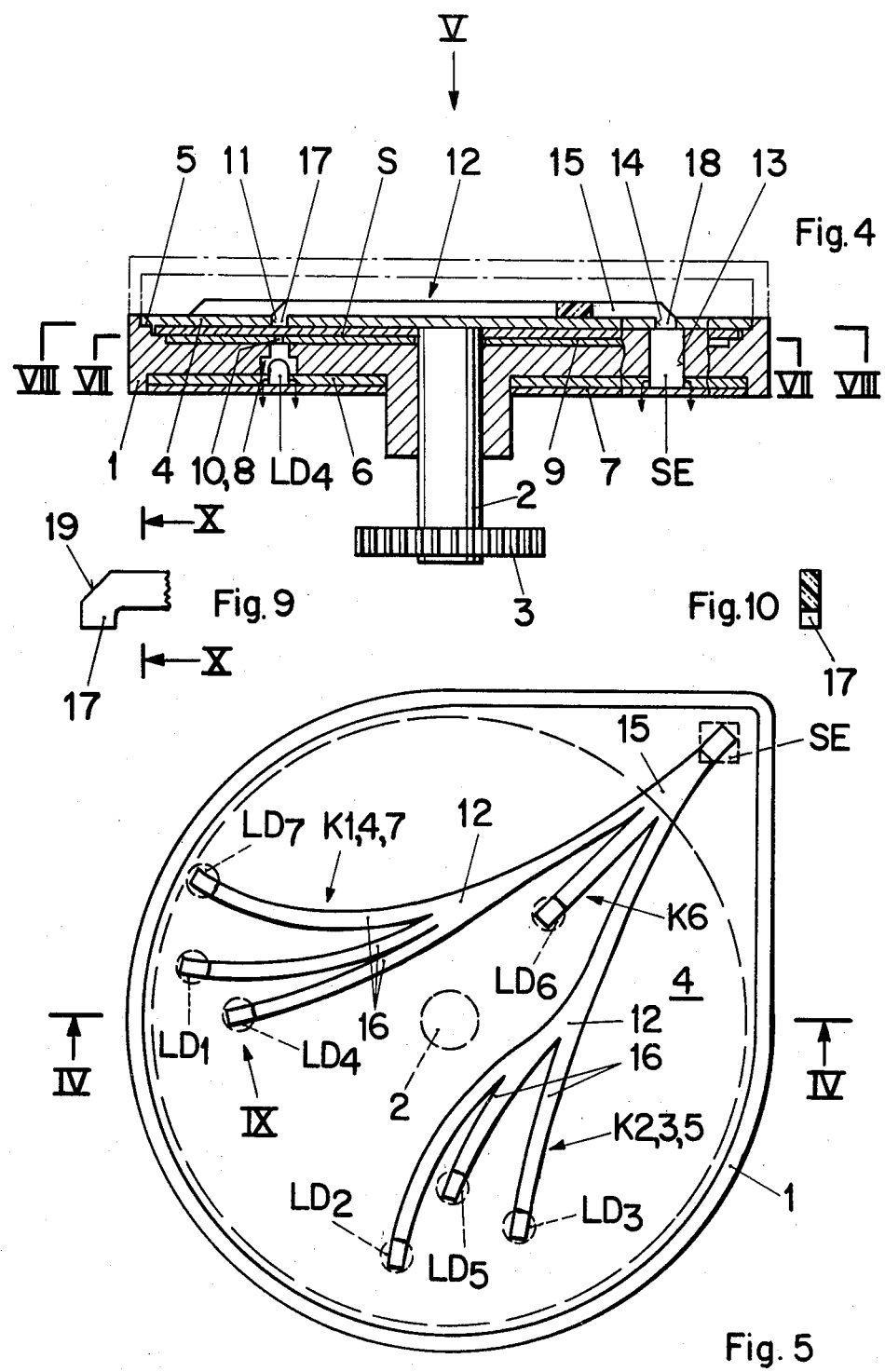

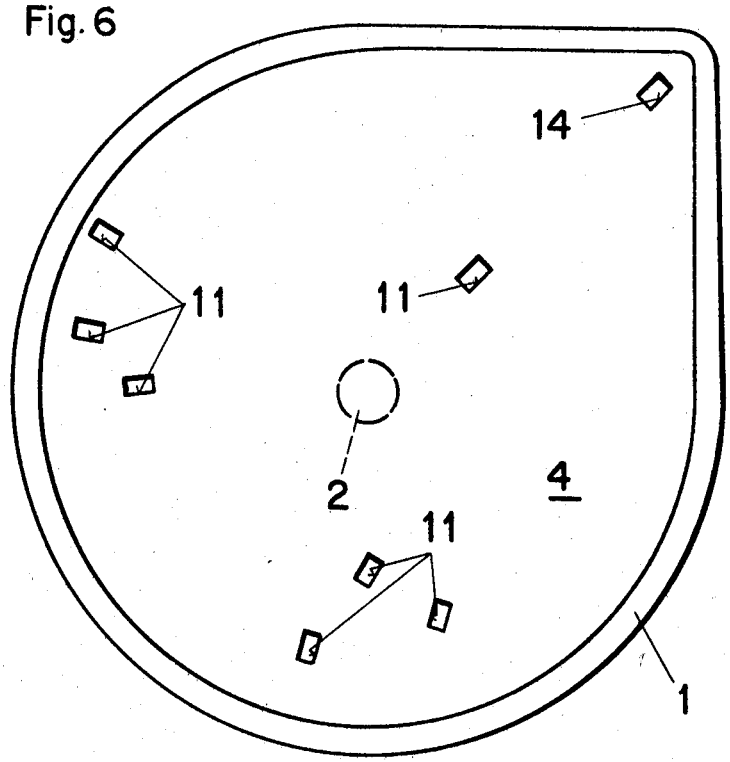
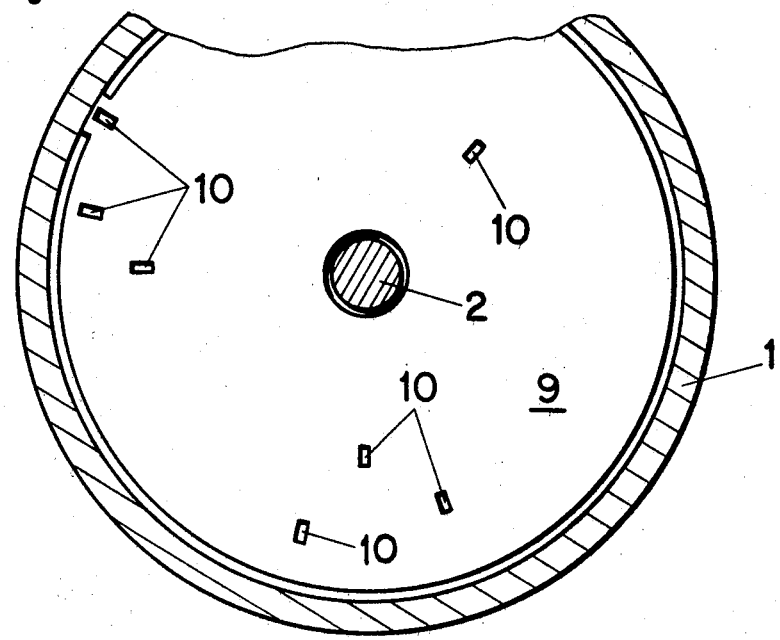

ARRANGEMENT FOR DETERMINING THE POSITION, ESPECIALLY THE ANGULAR POSITION, OF A MOVABLE BODY

BACKGROUND OF THE INVENTION

The present invention relates generally to an arrangement for detecting the position of a movable body, especially the angular position of a rotatable body. More particularly, the invention relates to an arrangement of this type in which the body has a plurality of tracks of markings thereon. The markings are distributed along and among the tracks in accordance with a predetermined code. The distribution of the markings may be such that the markings of the individual tracks respectively represent the digits of binary numbers indicating the momentary positions of the body. An arrangement for detecting the presence of the markings includes at least one signal generator and one signal receiver, as well as at least one signal transmitting channel which is controlled by the markings and extends between the signal generator and the signal receiver.

Various arrangements for the determination of the positions of movable bodies are already known, and some of them include a disc-shaped marking carrier or body which is provided with a plurality of annular, concentric tracks of markings. An arrangement of this type is described, for instance, in Steinbuch, "Taschenbuch der Nachrichtenverarbeitung" published by Springer-Verlag, 1962, Page 761. In this publication, the markings are constituted by electrically conductive track sections, and a source of electrical signals is provided as a common signal generator. This conventional arrangement further includes sliding contacts associated with the individual rows or tracks of the markings, as well as an associated signal conduit for each of the sliding contacts which serves as a signal-transmitting channel. Furthermore, this arrangement includes an individual signal receiver such as a relay or the like for each of the marking tracks. This conventional arrangement operates on the basis of parallel scanning of the markings and has a plurality of receivers which are arranged in parallelism with one another. Binary numbers constituting the coded position signal are generated in parallelism at the outputs of the respective receivers. In the event that it is desired to convert the parallel representation of the coded position signal into a series representation it is necessary to connect a parallel-to-serial converter to the outputs of the individual receivers.

The known arrangements for determining the position of a movable or rotatable body by the parallel scanning of marking tracks have relatively complicated circuitry due to the employment of multiple receivers and the fact that conversion of the parallel signals or numbers into serial signals or numbers may be required.

SUMMARY AND OBJECTS OF THE INVENTION

Accordingly, it is a general object of the present invention to avoid the disadvantages of the prior art.

More particularly, it is an object of the present invention to provide an arrangement for detecting the position of a movable body, especially the angular position of a rotatable body, which does not possess the disadvantages of the conventional arrangements of this type.

Yet more particularly, it is an object of the present invention to so construct an arrangement of the type here under consideration as to considerably reduce the number of components constituting the same and, consequently, the manufacturing cost of the arrangement.

A concomitant object of the present invention is to so design the arrangement as to be simple in construction, inexpensive to manufacture, and reliable in operation nevertheless.

An additional object of the present invention is to develop an arrangement of the aforementioned type which is capable of presenting the information concerning the position of the movable body either in parallel or serial form without incurring any substantial additional expenditures.

In pursuance of these objects and others which will become apparent hereafter, one feature of the present invention resides in an arrangement for determining the position of a movable body, especially the angular position of a rotatable body, which arrangement, briefly stated, comprises a plurality of tracks movable with the body past individual detecting locations for the respective tracks. The tracks include markings which are distributed along and among the tracks in accordance with a predetermined code. Means for detecting the presence of the markings at specified detecting locations includes means for transmitting detecting signals along a plurality of channels which are respectively associated with the detecting locations and define paths leading away from the respective detecting locations. A common signal receiver is arranged at those ends of at least some of the channels which are remote from the detecting locations and receives signals therefrom. Means is provided for so controlling the operation of the transmitting means as to establish a periodically repeating sequence of transmission of at least one of the detecting signals through each of the channels during each detecting period. In this connection, it is particularly advantageous when the arrangement further includes means for generating a control signal having a predetermined duration as well as a predetermined time correlation to the predetermined sequence of detecting signals, and means for utilizing the control signal to correlate the signals of the sequence to the respective tracks.

The common receiver, in conjunction with the sequentially activated transmitting means associated with the individual marking tracks, renders it possible to reduce the number and cost of the components constituting the circuitry of the arrangement to a fraction of that for the above-discussed conventional arrangements which employ the principle of parallel scanning and parallel transmission or display of the position-indicating signals. The arrangement of the present invention is particularly advantageous when the common receiver is used in conjunction with all of the marking tracks or channels; however, it is also conceivable and contemplated by the present invention to use more than one receiver of which at least one is associated with and shared by a plurality of marking tracks or transmission channels. This renders it possible to optimize the arrangement with respect to cost, on the one hand, and scanning speed or resolution capability, on the other hand. Also, the mixture of parallel and serial signal transmission made possible by the use of more than one receiver can bring about certain advantages in certain applications. The chronological sequential activation of the signal transmitting channels corresponds to a selective sampling of the binary digits of the coded position signal and renders it possible to obtain, independently of the speed of movement of the tracks, precise time constrictions for the individual binary scanning signals. This, in turn, renders it possible to reduce the complexity and cost of the circuitry which is used for processing the scanning signals. In addition, chronological and sequential activation of the signal transmitting channels enables parallel-to-serial conversion to be obtained without special circuitry so that circuitry for such a conversion can be omitted from the signal processing device which receives the signals from the receiver or receivers. Moreover selective and cyclical activation of the signal transmitting channels offers the advantage that, by simple sequential energization of the signal generators, the scanning frequency may be made independent of the movement of the carrier body which is provided with the marking tracks.

It is also possible to dispense with synchronization of the scanning cycles and the generally periodic movement of the marking carrier over, the entire range from standstill to maximum speed. To achieve this, it is merely necessary, in accordance with a further proposal of the present invention, to limit the maximum speed of the carrier body to a value at which the time required for the shortest of the markings to pass the respective detecting location exceeds, and preferably amounts to a multiple of, the scanning period.

According to an advantageous feature of the present invention, the detecting locations associated with the individual tracks of markings, as well as the markings themselves, are offset relative to one another by the same amounts as considered in the direction of movement of the carrier body. This expedient renders it possible to freely select the positions of the detecting locations in accordance with space requirements and structural considerations. In particular, the detecting locations can be arranged differently than in the conventional arrangements of this type where they are situated along a straight line extending transversely of the direction of movement of the marking carrier body (this is a radial line in conventional arrangements used for the currently preferred application of the present invention, namely, the determination of the angular position of a rotating carrier body such as, for instance, a disc-shaped body). There is no need to change the simple cyclical sequence of activation of the individual signal generators or transmitting channels in correspondence to the sequence of the binary digits of the encoded position signal inasmuch as the offset of the markings, that is, the binary digits, within the respective marking rows or tracks insures that the correct sequence of the serial scanning signals is obtained.

It is possible to dispense with this simple solution and instead use an uncoordinated arrangement of the detecting locations, on the one hand, and of the markings within the marking rows or tracks, on the other hand. However, the scanning or detecting signals which are then generated in a disordered sequence must be placed in the correct sequence by means of electronic storage or registering devices and appropriately programmed addressing and reading circuits. When this solution is used, any offsetting of the signal generators or detecting locations, on the one hand, and of the markings, on the other hand, is compensated for during the processing of the signals transmitted to the signal receiver or receivers. Thus, the signal processing circuitry may be said to "calibrate" the arrangement.

According to a particularly advantageous embodiment of the present invention, energizable and de-energizable generators of electromagnetic radiation are used as signal generators for the individual transmitting channels. The signal transmitting channels are then designed such that their transmissivities are regulated by the markings provided on the marking carrier. Under these circumstances, the signal receiver is constructed as an electromagnetic radiation receiver. The transmissivities of the signal transmitting channels are generally readily controlled by varying the degree to which the markings screen, obstruct or reflect the electromagnetic radiation. The properties of the markings are accommodated to the wavelength of the electromagnetic radiation used. The wavelength can be any wavelength within the spectrum which it is practical to use. However, visible and infrared radiation are particularly advantageous. It is especially advantageous when, in accordance with a currently preferred feature of the present invention, light emitting diodes are used as the signal generators. This results in a particularly simple and inexpensive construction, especially in view of the fact that such light emitting diodes can be easily activated by supplying electric current thereto.

In order to achieve bunching of the rays and to prevent signal disruption by undesired radiation, it is currently preferred for at least a part of each of the signal transmitting channels to be constructed as a light conductor.

It is currently preferred that the light emitting diodes emit radiation in the infrared range of the spectrum. This makes it possible to obtain bunching and guidance of the rays with little loss of the radiation even when the position-determining arrangement is very small, especially when at least those sections of the light conductors where the radiation is deflected consist of light-transparent synthetic plastic material such as, for example, polystyrene.

An extremely compact construction of the position-determining arrangement is achieved when, in accordance with a currently preferred aspect of the present invention, the signal generators and the signal receiver are arranged on the same axial side of the marking carrier. The signal receiver and signal generators can then be connected with a common printed circuit board and be arranged close to the marking carrier. The signal transmitting channels are arranged on the opposite side of the marking carrier from the signal generators and the signal receiver. It is particularly advantageous when the signal transmitting channels extend separately from the individual detecting locations but but are joined at a common stem in the region of the signal receiver. It is further favorable when the signal transmitting channels, that is, the separate branches and common stem, are of one piece. This enables at least the predominant portion of the signal transmitting channels to be manufactured by means of production processes such as forming or shaping which do not require material removal or machining. In this manner, uniform quality of the signal transmitting channels is assured and it becomes possible to mount the signal transmitting channels easily and rapidly. When the sections of the signal transmitting channels which are of one piece with one another are arranged in a common plane extending in parallelism with the disc-shaped marking carrier, it is possible to further reduce the dimensions of the position-determining arrangement.

The novel features which are considered as characteristic of the invention are set forth in particular in the appended claims. The improved position-determining arrangement itself, however, both as to its construction and its mode of operation, together with additional features and advantages thereof, will be best understood upon perusal of the following detailed description of certain specific embodiments with reference to the accompanying drawing.

BRIEF DESCRIPTION OF THE DRAWING

FIG. 4 is an axial sectional view of an arrangement as in FIG. 1 taken on a line IV—IV of FIG. 5;

FIG. 5 is a view taken in the direction of the arrow V of FIG. 4;

FIG. 6 is a view similar to that of FIG. 5, but with the light conductor omitted;

FIG. 8 is a sectional view taken along the line VIII—VIII of FIG. 4;

FIG. 9 is a view of a portion of a light conductor as seen in the direction of the arrow IX in FIG. 5; and FIG. 10 is a sectional view taken along the line X—X of FIG. 9.

DETAILED DESCRIPTION OF THE PREFERRED EMBODIMENTS

Figure 1:
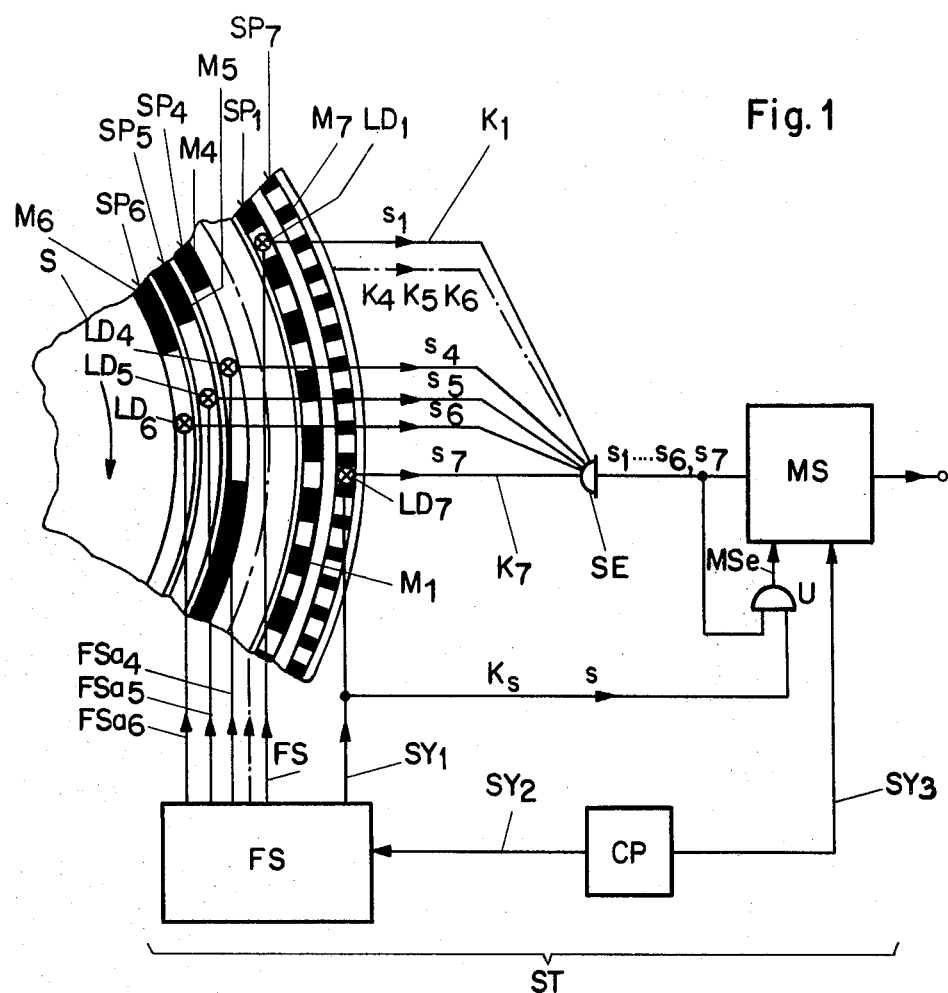
FIG. 1 is a block diagram of an arrangement for determining the angular position of a rotary marking carrier which is shown fragmentarily.

Referring now to the drawing in detail, and first to FIG. 1 thereof, it may be seen that the reference character S denotes a disc-shaped marking carrier or body which rotates, either on a continuous or on an intermittent basis, as indicated by an arrow, and the instantaneous angular position of which is to be determined. The carrier S is provided, for instance, with six rows of markings in the form of concentric tracks $SP_1$ to $SP_6$ (see also FIG. 7), these tracks including respective markings $M_1$ to $M_6$. The markings $M_1$ to $M_6$ are distributed along and among the tracks in accordance with a chosen code which, in the following, is assumed to be a simple binary number code. The lengths of the individual markings $M_1$ to $M_6$ as considered in the circumferential direction of the disc-shaped carrier S are also selected in accordance with this chosen code. In the illustrated embodiment of the present invention, which is not to be construed as being exclusive, electromagnetic radiation, especially in the visible range of the spectrum or in the neighboring ranges, e.g. the infrared light range, is used for scanning the tracks $SP_1$ to $SP_6$, detecting the presence or absence of the markings $M_1$ to $M_6$ at the respective detecting locations, and transmitting detecting signals indicative of the momentary position of the carrier S. As illustrated in the drawing, a light signal generator in the form of a light emitting diode $LD_1$ to $LD_6$ is provided for each of the tracks $SP_1$ to $SP_6$. However, it is also conceivable and contemplated by the present invention to utilize a single light source and selectively controllable light-transmitting channels or path portions for conducting the light emitted by the signal sources to the respective detecting locations. The markings $M_1$ to $M_6$ of the separate tracks $SP_1$ to $SP_6$, which respectively activate or render operative one of the signal transmitting channels $K_1$ to $K_6$ (see also FIG. 5) for the respective tracks $SP_1$ to $SP_6$, are differentiated in FIG. 1 of the drawing from the surrounding areas or interspaces therebetween by being solid black. The markings $M_1$ to $M_6$ render the transmitting channels $K_1$ to $K_6$ operative or active by being light-permeable, while the interspaces between the same are light-impermeable, when the channels $K_1$ to $K_6$ are arranged at the opposite side of the carrier S from the light emitting diodes $LD_1$ to $LD_6$. The markings $M_1$ to $M_6$ render the transmitting channels $K_1$ to $K_6$ operative or active by being light-reflective in the event that the light emitting diodes $LD_1$ to $LD_6$ and the channels $K_1$ to $K_6$ are arranged at the same side of the disc-shaped carrier S. However, it will be appreciated that, depending on the construction of the evaluating circuitry which will be discussed below, the interspaces between the zones $M_1$ to $M_6$ along the tracks $SP_1$ to $SP_6$ can constitute the markings while the regions $M_1$ to $M_6$ constitute the interspaces. The light emitting diodes $LD_1$ to $LD_6$ are successively activated or energized by associated control outputs $FSa_1$ to $FSa_6$ of a stepping circuit FS. The stepping circuit FS, which will be hereafter referred to as a distributing circuit, constitutes, together with a synchronizing clock CP and a switching circuit MS, a control circuit ST capable of coding the detecting signals and properly assigning these to the marking tracks $SP_1$ to $SP_6$. The optical signal transmitting channels $K_1$ to $K_6$ are coupled, at their output ends, with a common optical signal receiver SE which may be constituted, for instance, by a photoelectric cell, a phototransistor or a photodiode. The output of the optical signal receiver SE serially, that is, chronologically, supplies indicating signals $s_1$ to $s_6$ which are associated with the tracks $SP_1$ to $SP_6$. Basically, the switching circuit MS has the purpose of assuring proper correlation of the detecting signals $s_1$ to $s_6$ within the chronological sequence with the marking tracks $SP_1$ to $SP_6$ or with the binary positions of the coded position signal. This is achieved, in the illustrated embodiment of the present invention, by means of an additional signal transmitting channel $K_s$ which transmits electrical signals from a control output $SY_1$ of the distributing circuit FS and is activated at a predetermined instant during the aforementioned sequence of activation of the light-emitting diodes $LD_1$ to $LD_6$. For instance, as illustrated in FIG. 1, the signal transmitting channel $K_s$ may, within each scanning or transmission period, transmit to the switching circuit MS a signal s corresponding to the periodical mode of operation of the distributing circuit FS. The distributing circuit FS and the switching circuit MS are, in addition, synchronized with one another by means of the already mentioned synchronizing clock CP via synchronizing signal lines $SY_2$.

Figure 2:
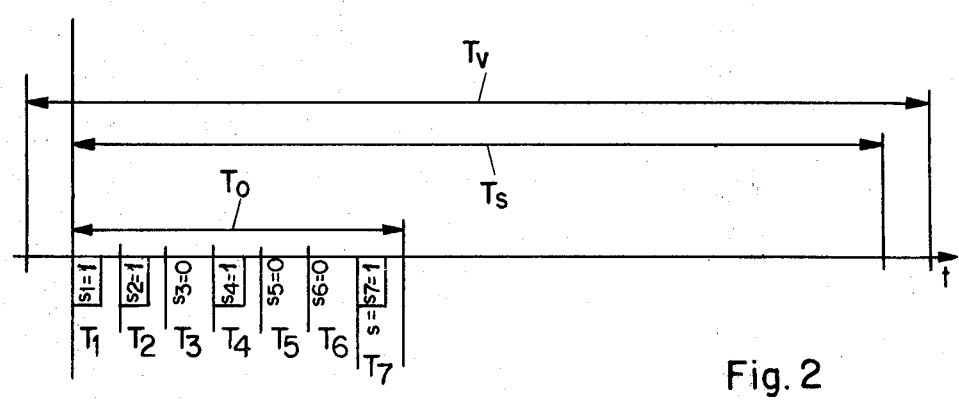
FIG. 2 is a diagram illustrating the time sequence and duration of various signals generated and transmitted during the operation of the arrangement of FIG. 1.

FIG. 2 illustrates, in a graphic manner, a scanning and signal transmitting cycle having a duration of $T_o$ and embracing seven scanning intervals $T_1$ to $T_7$ corresponding to the detecting signals $s_1$ to $s_6$ as well as the control signal s which is always at the last position within each cycle. The illustrated example relates to a position signal having the binary values 110100 for the detecting signals $s_1$ to $s_6$. The control signal s, which is always generated at a predetermined time relative to the detecting signals $s_1$ to $s_6$ (here the last time interval within the cycle), renders it possible for the switching circuit MS to assign each sequence of 6 detecting signals s₁ to s₆ to a six digit binary coded position signal.

The exemplary embodiment of FIG. 1 further illustrates an additional marking row in the form of an additional track SP₇ having corresponding markings M₇. The length of each of these markings M₇ as considered in the circumferential direction of the disc-shaped carrier S is always less than that of the shortest of the markings M₁ to M₆ which generate the coded position signals. An additional signal generator or light emitting diode LD₇ is associated with this additional track SP₇ and is also activated or energized by the control output SY₁ of the distributing circuit FS. An additional detecting signal s₇, which occurs simultaneously with the control signal s when the associated optical signal transmitting channel K₇ is activated by a marking M₇, is generated by the light emitting diode LD₇ during the interval T₇ of the period T₀. The switching circuit MS has a control input MS$_e$ which is connected via an AND-gate U with the output of the common signal receiver SE and the output SY₁ of the distributing circuit FS. Thus, the detecting signal succession is transmitted to the control input MS$_e$ only when the same occurs within a period T$_s$ which corresponds to the presence of a marking M₇ at the detecting location at which the light emitting diode LD₇ is situated. The length of this period T$_s$ is indicated in FIG. 2. The maximum speed of rotation of the carrier S and the lengths of the markings M₇ in the peripheral direction of the carrier S, are so coordinated that this period T$_s$ always exceeds, and preferably amounts to a multiple of, the duration of the scanning period T₀. On the other hand, the period T$_s$, which is related to the lengths of the markings M₇, is shorter than the period of time T$_v$ which corresponds to the time required for the shortest one of the markings M₁ to M₆ to pass the corresponding signal generator LD₁ to LD₆, that is, the respective detecting location. In this manner, there is avoided the transmission of garbled detecting signals at the transition regions between the markings M₁ to M₆ and the adjacent interspaces. It will be appreciated that correlation of the detecting signals by a separate control signal generated at a defined instant within the scanning or detecting cycle, on the one hand, and the screening or masking of the detecting or scanning cycle in dependence upon the position of the carrier S with respect to a signal generator in order to suppress garbled signals, on the other hand, basically represent two mutually independent functions. The coupling of these two functions in the exemplary embodiment of FIG. 1, where control signals s₇ and s are simultaneously transmitted through the optical transmission channel K₇ and the electric synchronizing channel K$_s$, respectively, and subsequently juxtaposed at the AND-gate U, constitutes an advantageous solution. The resulting control signal at the input MS$_e$ of the switching circuit MS, which is obtained by the juxtaposition of the signals s₇ and s at the AND-gate U, has the combined function of achieving proper signal correlation, on the one hand, and suppressing detecting cycles, on the other hand. The latter occurs when the control signal is blocked due to a lack of transmission of the signal s₇ through the channel K₇.

It is further to be understood that any predetermined instant within the respective detecting cycles, and not only a predetermined instant within the last time interval T₇ of the scanning period T₀, may be used for regulation of the detecting cycles. The additional electrical synchronizing channel K$_s$ and corresponding control signal s introduced into the sequence of detecting signals s₁ to s₆ provide the advantage of simplicity regardless of the predetermined instant which is selected. However, it is possible to dispense with the control signal s and instead, for example, cause one of the detecting signals s₁ to s₆ to differ from the remainer. Nevertheless this ordinarily increase the duration of the detecting period and the cost of the required equipment and reduces resolution.

Finally, it is to be pointed out that it is not absolutely necessary to synchronize the distributing circuit FS and the switching circuit MS, by means of a common synchronizing clock CP and respective synchronizing lines SY₂. Thus, it is possible to control the switching circuit MS by the output signals of the common signal receiver SE in conjunction with appropriate regulation of the detecting cycles, but without synchronization of the switching circuit MS with the individual detecting intervals within each detecting or scanning cycle.

Figure 3:
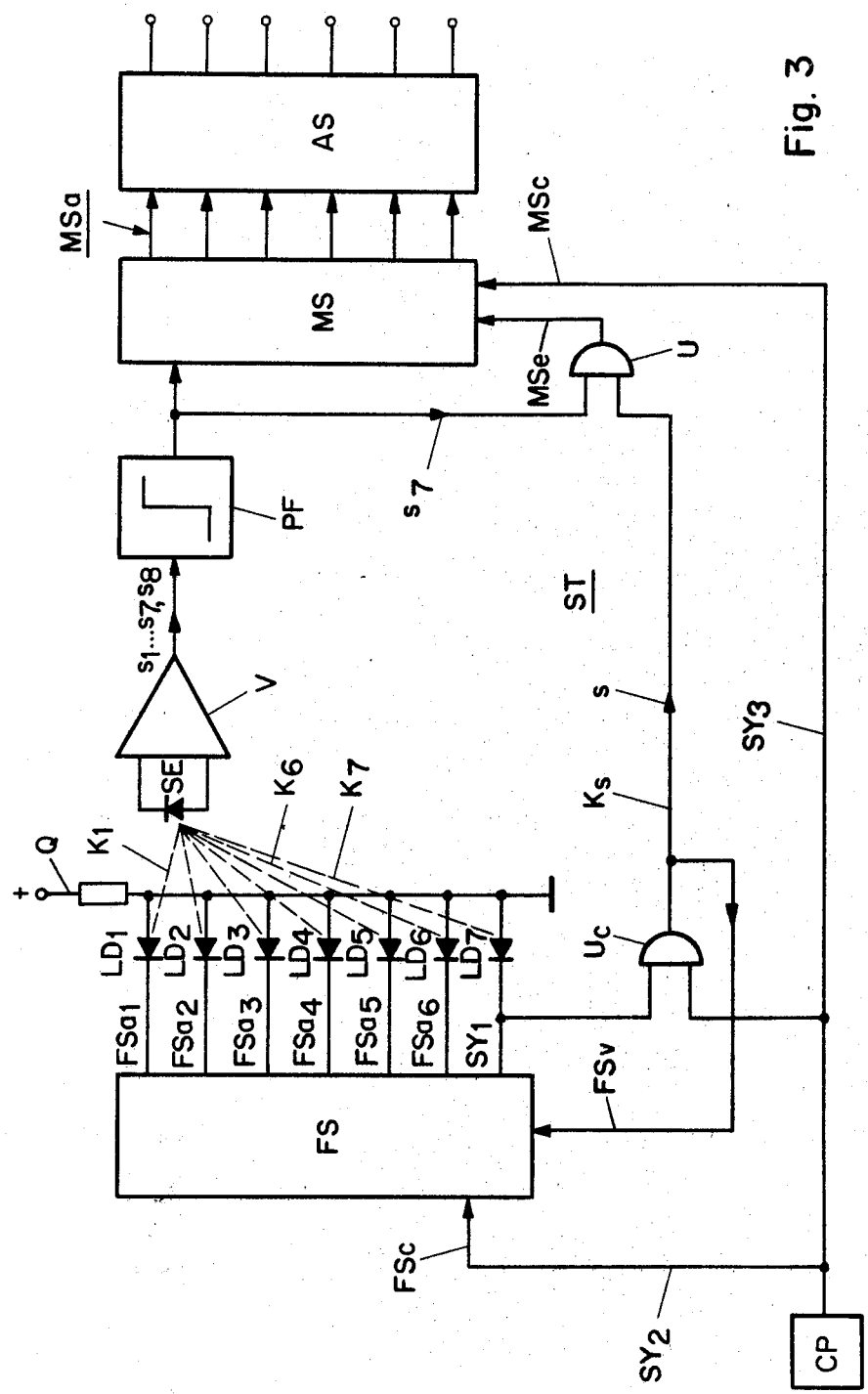
FIG. 3 is a block diagram showing additional details of the electronic part of the arrangement shown in FIG. 1.

FIG. 3 illustrates some additional details of the circuitry which may be employed in the arrangement of FIG. 1. FIG. 3 shows the connection of the signal generating light emitting diodes LD₁ to LD₆, and of the additional light emitting diode LD₇, to the corresponding outputs FSa₁ to FSa₆ and the additional output SY₁ of a commercially available binary counter, which may constitute the distributing circuit FS, and to a common supply source Q. The optical signal transmitting channels K₁ to K₆ and the additional channel K₇ which lead, for instance, to a photodiode constituting the common signal receiver SE, are indicated in broken lines. Am amplifier V and a pulse forming device PF, both of which are conventional and commercially available, are arranged behind the signal receiver SE and are used for handling the detecting signals s₁ to s₆ and the additional signal s₇. The following switching circuit MS can be constructed as a conventional shift register having a shifting input MSc and a plurality of parallel outputs MSa for the transmission of the contents of the switching circuit MS into a parallel output storage device AS. This transmission occurs as a result of the already explained cooperation of the detecting signal s₇ and the control signal s at the AND-gate U the output of which is connected to the control input MSe of the switching circuit MS. The transfer of the contents of the switching circuit MS into the output storage device AS indicates the occurrence of a scanning or detecting cycle and thus signifies a 6-digit binary position signal. The design of the switching circuit MS as a shift register having a plurality of parallel outputs in conjunction with the use of a corresponding output storage device AS as in the illustrated embodiment of the present invention results in a transition from a serial to a parallel representation of the position-indicating signals. However, this is not a basic requirement but only an additional possible aspect of the present invention.

The introduction of the detecting signals s₁ to s₇ into the shift register or switching circuit MS occurs synchronously with the step-by-step operation of the counter of the distributing circuit FS which is controlled by the common synchronizing clock CP. The synchronization is achieved via the already mentioned synchronizing lines SY₂ which are respectively connected to a stepping input FS$_c$ of the distributing circuit FS and to the already mentioned input MS$_c$ of the switching circuit MS. Furthermore, the occurrence of the control signal s in the channel K$_s$ is synchronized with the counter of the distributing circuit FS and with the shift register or switching circuit MS by means of a further AND-gate Uc having an input wich is connected to the output $SY_1$ of the distributing circuit FS.

Figure 7:
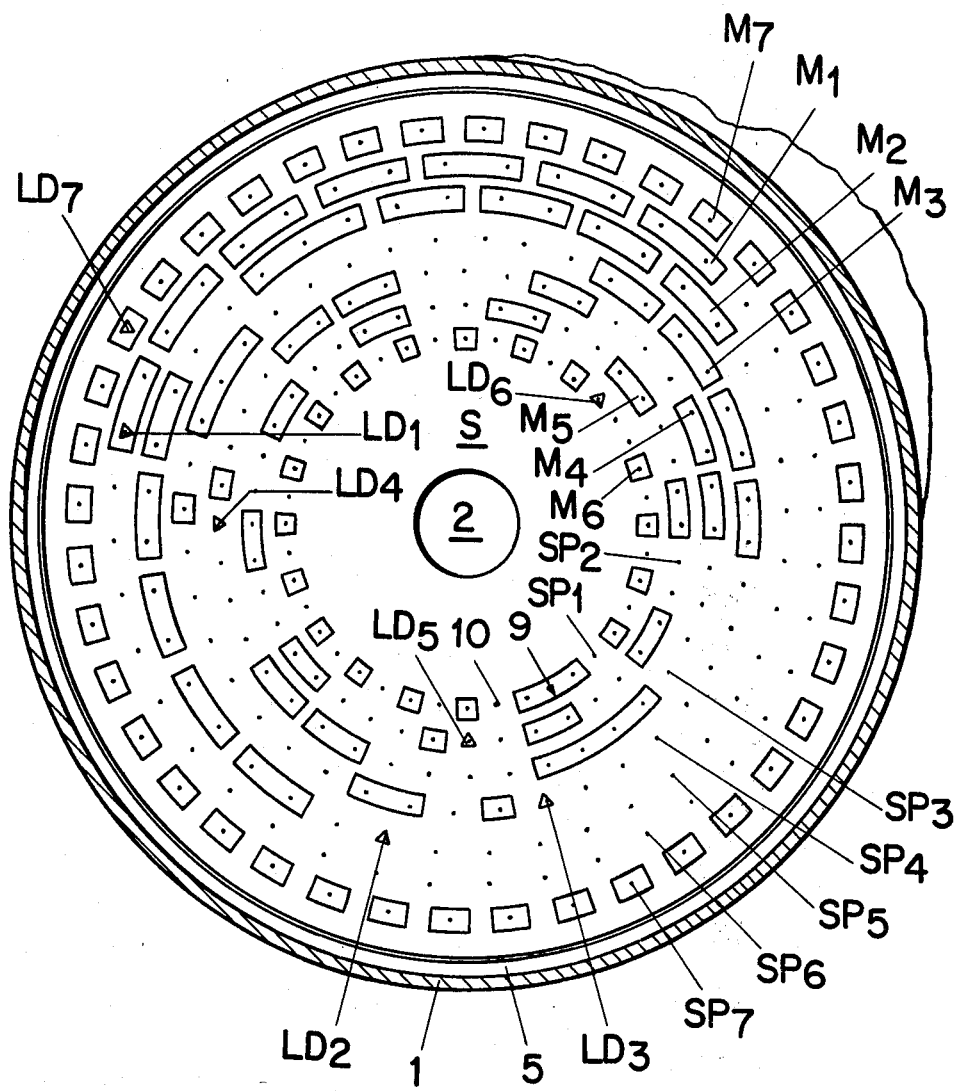
FIG. 7 is a sectional view taken on line VII—VII of FIG. 4.

As shown in detail in FIGS. 4 to 7, the position determining arrangement of the present invention includes a support plate 1 in which there is rotatably supported a shaft 2 equipped with a driven pinion 3. The pinion 3 is or may be driven in rotation from a motor which has been omitted from the drawing, e.g., via an interposed gear wheel or gear wheel train. The marking carrier S already discussed above is mounted on the upper end of the driven shaft 2 for rotation therewith. The carrier S is provided with the six marking tracks $SP_1$ to $SP_6$ as well as the additional marking track $SP_7$. As shown in FIG. 7, the marking tracks $SP_1$ to $SP_7$ are arranged concentrically to the axis of rotation of the shaft 2. When the shaft 2 rotates, the marking carrier S rotates about the axis of the shaft 2 as well and at the same angular speed. The marking carrier S is covered by a covering plate 4 which is arranged slightly above the carrier S and is supported, at its periphery, on a shoulder 5 of the carrier plate 1.

The marking carrier S is provided with the markings $M_1$ to $M_7$ distributed along the respective concentric tracks $SP_1$ to $SP_7$. In the illustrated embodiment of the present invention, the markings $M_1$ to $M_7$ are formed by slots in the carrier S, these slots alternating with and being separated from one another by light-intercepting zones of the carrier S. One of the light-emitting diodes $LD_1$ to $LD_7$, which preferably operate in the infrared light range, is associated with each of the tracks $SP_1$ to $SP_7$. As can be best seen in FIG. 4, the light emitting diodes $LD_1$ to $LD_7$ are mounted on a plate-shaped diode support 6 and are electrically connected to a juxtaposed printed circuit plate 7. Concentrically to each of the light emitting diodes $LD_1$ to $LD_7$, there is provided in the support plate 1 a through bore 8 via which the light emitting diodes $LD_1$ to $LD_7$ can illuminate the corresponding tracks $SP_1$ to $SP_7$ of the marking carrier S. A disc-shaped diaphram 9 is arranged between the upper open ends of the bores 8, on the one hand, and the marking carrier S, on the other hand, and is mounted on the support plate 1. The diaphram 9 is arranged at an extremely small distance from the marking carrier S and is provided with a plurality of apertures 10, each associated and registering with one of the light emitting diodes $LD_1$ to $LD_7$. Preferably, the cross sectional area of each of the diaphram openings 10 is substantially smaller than that of the smallest one of the light-permeable markings $M_1$ to $M_7$ in the marking carrier S.

The plate 4 is provided, in registry with each of the diaphram apertures 10, with a respective passage 11 which accommodates an end portion 17 of a light conductor 12. The diode support 6 further supports the receiver SE which is also connected to the printed circuit board 7. The receiver SE extends through a bore 13 of the support 6 and the support plate 1 all the way to an end portion 18 of the light conductor 12. The plate is provided, in the axial extension of the bore 13, with a passage 14 accommodating the end portion 18 of the light conductor 12. As shown in FIGS. 5, 9 and 10, the light conductor 12 has a rectangular cross section and includes a plurality of different branches 16 which are brought together into a common stem 15. The light conductor 12 is provided, at the ends of the branches 16, with the downwardly extending end portions 17 and, at the end of the stem 15, with the aforementioned end portion 18. The end portions 17 and 18 are received in the respective passages 11 and 14 of the plate 4. The light conductor 12 is provided, upwardly of the end portions 17 and 18, with deflecting surfaces 19 which deflect the light rays emitted by the light emitting diodes $LD_1$ to $LD_7$ in the direction of the light conductor 12 and toward the receiver SE. The courses of the individual branches 16 of the light conductor 12 are selected such that the light rays which impinge upon the surfaces bounding the light conductor 12 are invariably, or at least predominantly, deflected back into the light conductor 12. Preferably, the light conductor 12 consists of a polystrene having a light transmissivity corresponding to that of glass, the polystrene marketed under the designation 168 N glasklar 015 by the Badische Anilin und Sodafabrik AG in Ludwigshafen. The bores 8, the diaphram apertures 10, and the passages 11 and 14, as well as the light conductors 12, together form the signal transmitting channels $K_1$ to $K_7$ between the light emitting diodes $LD_1$ to $LD_7$ and the receiver SE. These signal transmitting channels $K_1$ to $K_7$ are separated from one another at the diode side of the marking carrier S.

As can be ascertained from FIG. 7, the light emitting diodes $LD_1$ to $LD_7$ are not arranged along a radially extending line of the marking carrier S or the support 6. Rather, in order to obtain a compact construction of the arrangement, the light emitting diodes $LD_1$ to $LD_7$ and the corresponding detecting locations are distributed along the circumferential direction of the arrangement. In this connection, it is advantageous when the markings $M_1$ to $M_7$ of the individual tracks $SP_1$ to $SP_7$ are spatially distributed along the circumferential direction of the marking carrier S in the same pattern as the detecting locations.

The individual light emitting diodes $LD_1$ to $LD_7$ are activated or operated in chronological succession by the control arrangement ST in the manner discussed above while the signal transmitting channels $K_1$ to $K_7$ are controlled by the respective markings $M_1$ to $M_7$. When the dimensions of the arrangement are not critical, the light emitting diodes $LD_1$ to $LD_7$ may be arranged along a common line extending radially the marking carrier S or of the support 6.

In accordance with another exemplary embodiment of the present invention which has not been illustrated in the drawings, the receiver SE is arranged at the opposite side of the marking carrier S, that is, at the same side as the light conductor 12. In this situation, the light conductor 12 constituting the channels $K_1$ to $K_7$ extends through space from the marking carrier S toward the receiver SE. However, this additional embodiment of the present invention can only be utilized when the space assumed by the arrangement of the present invention is not of critical importance.

Without further analysis, the foregoing will so fully reveal the gist of the present invention that others can, by applying current knowledge, readily adapt it for various applications without omitting features that, from the standpoint of prior art, clearly constitute essential characteristics of the generic and specific aspects of our contribution to the art and, therefore, such adaptations should and are intended to be comprehended within the meaning and range of equivalence of the claims.

We claim:

1. An arrangement for determining the position of a body having a plurality of tracks of position markings representing coded position information, said arrangement comprising:

(a) a signal generator associated with each of said tracks and arranged to direct detecting signals towards the respective track;

(b) a transmitting channel associated with each of said tracks and arranged to convey information signals received from the respective track in response to said detecting signals away from the respective track;

(c) a signal receiver for said information signals operatively associated with at least some of said transmitting channels;

(d) controlling means operative to cause a batch of said information signals including an information signal from each of said tracks to be delivered to said signal receiver in periodic cycles, said controlling means further being operative to cause the information signals of each batch to be delivered to said signal receiver in a predetermined sequence, and said controlling means also being operative to generate a control signal at a predetermined instant during each of said cycles so as to enable the information signals of each batch to be correlated with the respective tracks;

(e) generating means for intermittently generating a safety signal to prevent garbling of said information signals; and (f) blocking means for blocking said information signals and operative to pass the same only when said control and safety signal are generated simultaneously.

2. The arrangement as defined in claim 1, comprising means for correlating said information signals to the respective tracks.

3. The arrangement as defined in claim 1, wherein said receiver is situated at the opposite side of said body from said signal generators.

4. The arrangement as defined in claim 1, wherein said channels are funnel-shaped sections and converge from said body toward said receiver.

5. The arrangement as defined in claim 1, wherein said generating means comprises an additional track of control markings and an additional signal generator for directing detecting signals towards said additional track; and further comprising an additional transmitting channel for conveying information signals away from said additional track.

6. The arrangement as defined in claim 1, wherein said controlling means is arranged to activate said signal generators in said predetermined sequence.

7. The arrangement as defined in claim 6, wherein said controlling means includes an output for each of said signal generators.

8. The arrangement as defined in claim 1, wherein said signal generators and said receiver are situated at the same side of said body.

9. The arrangement as defined in claim 1, wherein the markings of the different tracks are offset from one another in accordance with a predetermined pattern and the positions of said signal generators with respect to one another correspond to said pattern.

10. The arrangement as defined in claim 1, wherein said body comprises a carrier disk mounted for rotation about an axis and said tracks are annular and centered on said axis.

11. The arrangement as defined in claim 1, wherein said signal generators emit electromagnetic radiation and said markings influence the radiation transmissivity of said channels.

12. The arrangement as defined in claim 1, wherein said signal generators comprise light emitting diodes, and each of said channels comprises a light conductor.

13. The arrangement as defined in claim 12, wherein said light conductors constitute individual branches of a light-conductive element which are joined at a common stem in the region of said receiver.

14. The arrangement as defined in claim 7, wherein said controlling means has an additional output which is connected with said signal receiver.

15. The arrangement as defined in claim 14, wherein said additional output is connected with an output of said signal receiver.

16. The arrangement as defined in claim 11, wherein an aperture of predetermined size is arranged intermediate the respective signal generators and channels.

17. The arrangement as defined in claim 16, comprising a diaphragm intermediate said signal generators and said body, said diaphragm being provided with said apertures.

18. The arrangement as defined in claim 12, wherein said diodes emit light substantially in the infrared range of the spectrum.

19. The arrangement as defined in claim 12, wherein said light conductors comprise a light-conductive thermoplastic material.

20. The arrangement as defined in claim 13, wherein said branches and said stem of said light-conductive element are of one piece with one another.

21. The arrangement as defined in claim 13, said body comprising a rotatable disc; and wherein said branches and said stem are located in a common plane which is parallel to the plane of said disc.

22. The arrangement as defined in claim 5, wherein said control markings have a length which is less than that of the shortest of said position markings.

23. The arrangement as defined in claim 5, wherein said additional transmitting channel is operatively associated with said signal receiver.

24. The arrangement as defined in claim 1, wherein the length of the shortest of said position markings is such that the travel time of said shortest position marking by the respective signal generator at the maximum speed of said body exceeds the duration of any of said cycles.

25. The arrangement as defined in claim 1, wherein the position markings of the respective tracks have different lengths.

26. The arrangement as defined in claim 1, wherein said position markings represent a binary code.

27. The arrangement as defined in claim 1, wherein said signal receiver is operatively associated with all of said transmitting channels.

28. The arrangement as defined in claim 22, wherein said length is such that the travel time of any of said control markings past said additional signal generator at the maximum speed of said body exceeds the duration of any of said cycles.

29. The arrangement as defined in claim 28, wherein said travel time is a multiple of said duration.

* * * * *